(12) United States Patent
Hanashima et al.

(10) Patent No.: US 11,387,097 B2
(45) Date of Patent: Jul. 12, 2022

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Takeo Hanashima, Toyama (JP); Hiroto Yamagishi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 50 days.

(21) Appl. No.: 17/024,784

(22) Filed: Sep. 18, 2020

(65) Prior Publication Data
US 2021/0013032 A1    Jan. 14, 2021

Related U.S. Application Data

(63) Continuation of application No. PCT/JP2018/010967, filed on Mar. 20, 2018.

(51) Int. Cl.
*H01L 21/02* (2006.01)
*C23C 16/455* (2006.01)
(Continued)

(52) U.S. Cl.
CPC .. *H01L 21/02263* (2013.01); *C23C 16/45527* (2013.01); *H01L 21/02164* (2013.01);
(Continued)

(58) Field of Classification Search
CPC ......... H01L 21/02263; H01L 21/02164; H01L 21/32105; H01L 21/67017;
(Continued)

(56) References Cited

U.S. PATENT DOCUMENTS

| 2007/0020392 A1* | 1/2007 | Kobrin | .................... C03C 17/42 427/532 |
| 2008/0087945 A1* | 4/2008 | Forbes | .............. H01L 21/28202 257/E29.302 |

(Continued)

FOREIGN PATENT DOCUMENTS

JP    2014-216342 A    11/2014

OTHER PUBLICATIONS

International Search Report, PCT/JP2018/010967, dated Jun. 12, 2018, 2 pgs.

*Primary Examiner* — Mohammed Shamsuzzaman
(74) *Attorney, Agent, or Firm* — Volpe Koenig

(57) ABSTRACT

There is provided a technique that includes: forming an initial oxide layer on a surface of a substrate by performing a set m times (where m is an integer equal to or greater than 1), the set including non-simultaneously performing: (a) oxidizing the surface of the substrate under a condition that an oxidation amount of the substrate increases from an upstream side to a downstream side of a gas flow by supplying an oxygen-containing gas and a hydrogen-containing gas to the substrate; and (b) oxidizing the surface of the substrate under a condition that the oxidation amount of the substrate decreases from the upstream side to the downstream side of the gas flow by supplying the oxygen-containing gas and the hydrogen-containing gas to the substrate; and forming a film on the initial oxide layer by supplying a precursor gas to the substrate.

14 Claims, 8 Drawing Sheets

(51) Int. Cl.
*H01L 21/321* (2006.01)
*H01L 21/67* (2006.01)

(52) U.S. Cl.
CPC .. *H01L 21/32105* (2013.01); *H01L 21/67017* (2013.01); *H01L 21/67253* (2013.01)

(58) Field of Classification Search
CPC ......... H01L 21/67253; H01L 21/02211; H01L 21/02238; H01L 21/02304; H01L 21/0228; C23C 16/45527; C23C 16/0218; C23C 16/401; C23C 16/45534; C23C 16/0272; C23C 16/45525
See application file for complete search history.

(56) References Cited

U.S. PATENT DOCUMENTS

| | | | |
|---|---|---|---|
| 2014/0220788 A1* | 8/2014 | Sano | C23C 16/45525 118/725 |
| 2014/0256156 A1* | 9/2014 | Harada | H01L 21/02205 118/704 |
| 2014/0315393 A1 | 10/2014 | Ozaki et al. | |
| 2015/0093911 A1* | 4/2015 | Nakatani | C23C 16/52 438/761 |
| 2015/0228473 A1* | 8/2015 | Yabe | C23C 16/45553 118/725 |
| 2018/0350587 A1* | 12/2018 | Jia | H01L 21/02205 |

\* cited by examiner

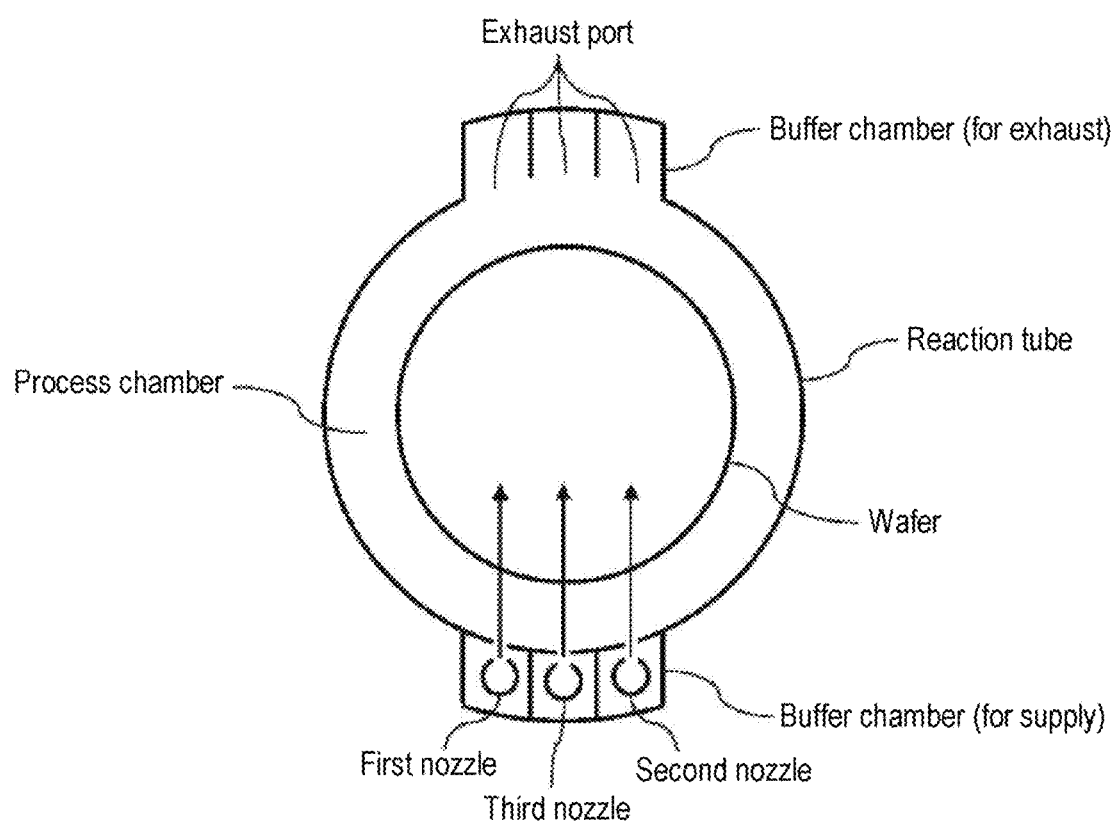

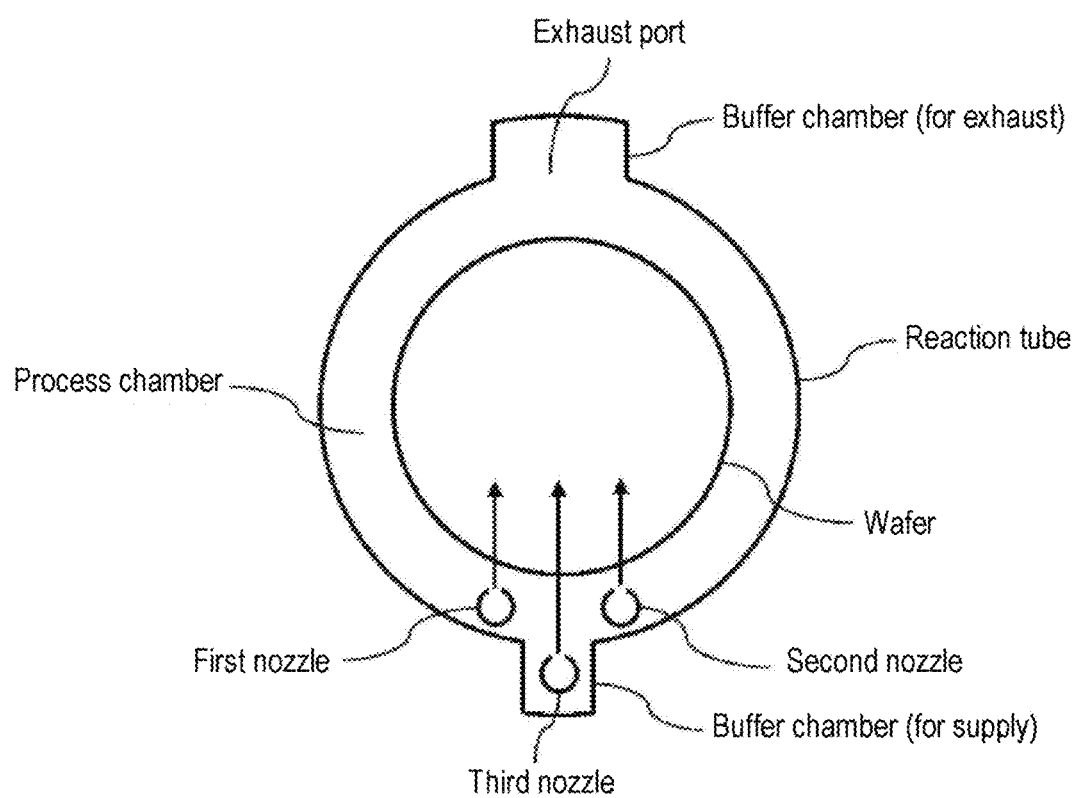

US 11,387,097 B2

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2018/010967, filed on Mar. 20, 2018, the entire contents of which are incorporated herein by reference.

TECHNICAL FIELD

The present disclosure relates to a method of manufacturing a semiconductor device, a substrate processing apparatus, and a recording medium.

BACKGROUND

In the related art, as a process of manufacturing a semiconductor device, a substrate processing process of oxidizing a surface of a substrate and then forming a film on the substrate may be often carried out.

SUMMARY

The present disclosure provides some embodiments of a technique capable of improving a film thickness uniformity of a film formed on a substrate.

According to one embodiment of the present disclosure, there is provided a technique that includes: forming an initial oxide layer on a surface of a substrate by performing a set m times (where m is an integer equal to or greater than 1), the set including non-simultaneously performing: (a) oxidizing the surface of the substrate under a condition that an oxidation amount of the substrate increases from an upstream side to a downstream side of a gas flow by supplying an oxygen-containing gas and a hydrogen-containing gas to the substrate; and (b) oxidizing the surface of the substrate under a condition that the oxidation amount of the substrate decreases from the upstream side to the downstream side of the gas flow by supplying the oxygen-containing gas and the hydrogen-containing gas to the substrate; and forming a film on the initial oxide layer by supplying a precursor gas to the substrate.

BRIEF DESCRIPTION OF DRAWINGS

FIGS. 5A and 5B are cross-sectional views showing a vertical process furnace of a substrate processing apparatus suitably used in some embodiments of the present disclosure.

DETAILED DESCRIPTION

Some Embodiments of the Present Disclosure

Some embodiments of the present disclosure will be now described with reference to FIGS. 1 to 4, and the like.

(1) Configuration of Substrate Processing Apparatus

Figure 1:
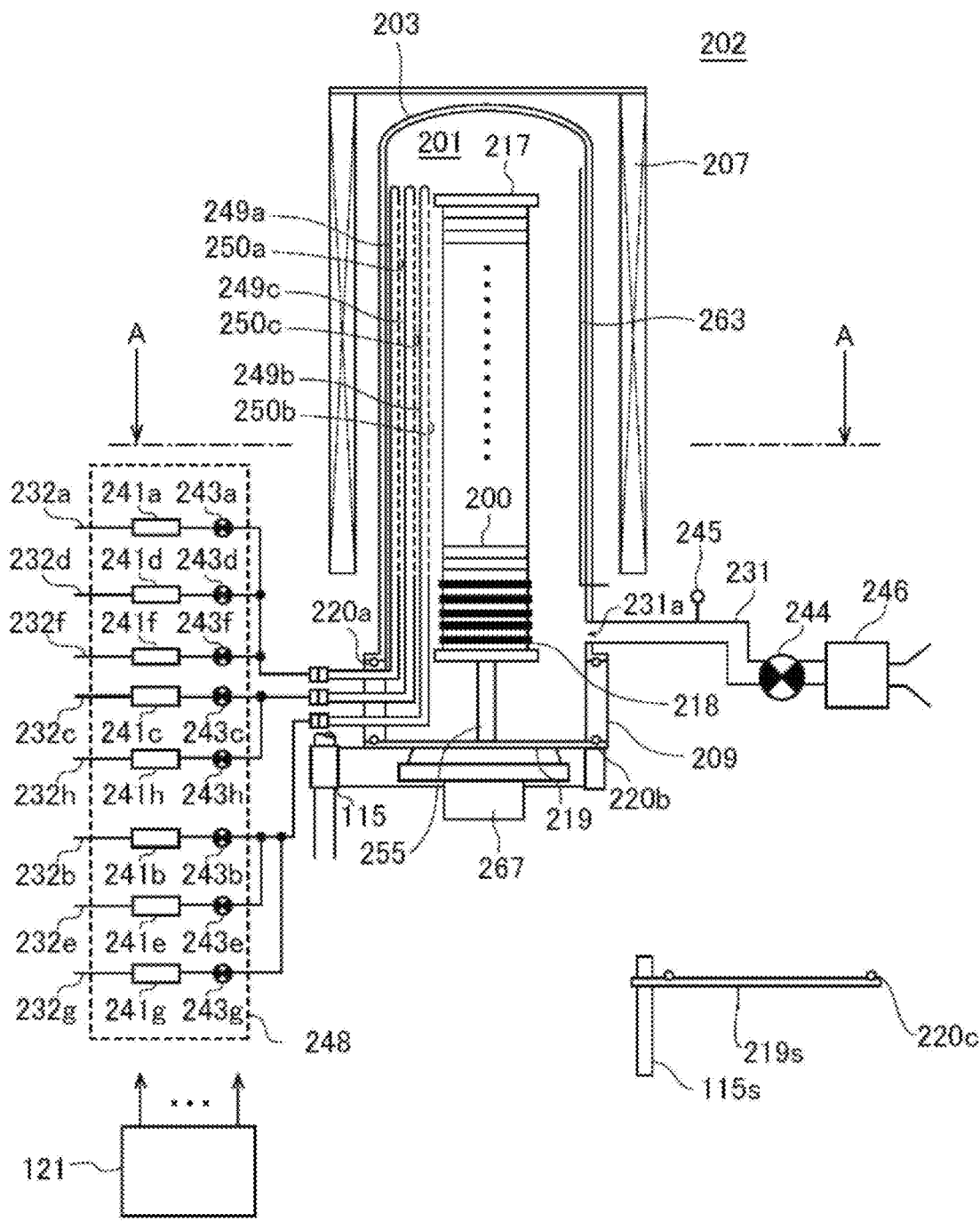
FIG. 1 is a schematic configuration view of a vertical process furnace of a substrate processing apparatus suitably used in some embodiments of the present disclosure, in which a portion of the process furnace is shown in a vertical cross section.

As illustrated in FIG. 1, a process furnace 202 includes a heater 207 as a heating mechanism (a temperature adjustment part). The heater 207 has a cylindrical shape and is supported by a support plate so as to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of, for example, a heat resistant material such as quartz ($SiO_2$), silicon carbide (SiC), or the like, and has a cylindrical shape with its upper end closed and its lower end opened. A manifold 209 is disposed to be concentric with the reaction tube 203 under the reaction tube 203. The manifold 209 is made of, for example, a metal material such as stainless steel (SUS), or the like, and has a cylindrical shape with both of its upper and lower ends opened. The upper end portion of the manifold 209 engages with the lower end portion of the reaction tube 203 so as to support the reaction tube 203. An O-ring 220a serving as a seal member is installed between the manifold 209 and the reaction tube 203. Similar to the heater 207, the reaction tube 203 is vertically installed. A processing container (reaction container) mainly includes the reaction tube 203 and the manifold 209. A process chamber 201 is formed in a hollow cylindrical portion of the processing container. The process chamber 201 is configured to be capable of accommodating wafers 200 as substrates. The wafers 200 are processed in the process chamber 201.

Nozzles 249a to 249c as first to third supply parts are installed in the process chamber 201 so as to penetrate through a sidewall of the manifold 209. The nozzles 249a to 249c are also referred to as first and third nozzles, respectively. Gas supply pipes 232a to 232c are connected to the nozzles 249a to 249c, respectively. The nozzles 249a to 249c are different nozzles, and each of the nozzles 249a and 249b is installed adjacent to the nozzle 249c such that the nozzles 249a and 249b are disposed to sandwich the nozzle 249c from both sides. The gas supply pipes 232a to 232c may be included in the first to third supply parts, respectively.

Mass flow controllers (MFCs) 241a to 241c, which are flow rate controllers (flow rate control parts), and valves 243a to 243c, which are opening/closing valves, are installed in this order at the gas supply pipes 232a to 232c, respectively, from an upstream side of a gas flow. Gas supply pipes 232d and 232f are respectively connected to the gas supply pipe 232a at the downstream side of the valves 243a. Gas supply pipes 232e and 232g are respectively connected to the gas supply pipe 232b at the downstream side of the valves 243b. A gas supply pipe 232h is connected to the gas supply pipe 232c at the downstream side of the valves 243c. MFCs 241d to 241h and valves 243d to 243h are installed in this order at the gas supply pipes 232d to 232h, respectively, from the upstream side of the gas flow.

Figure 2:
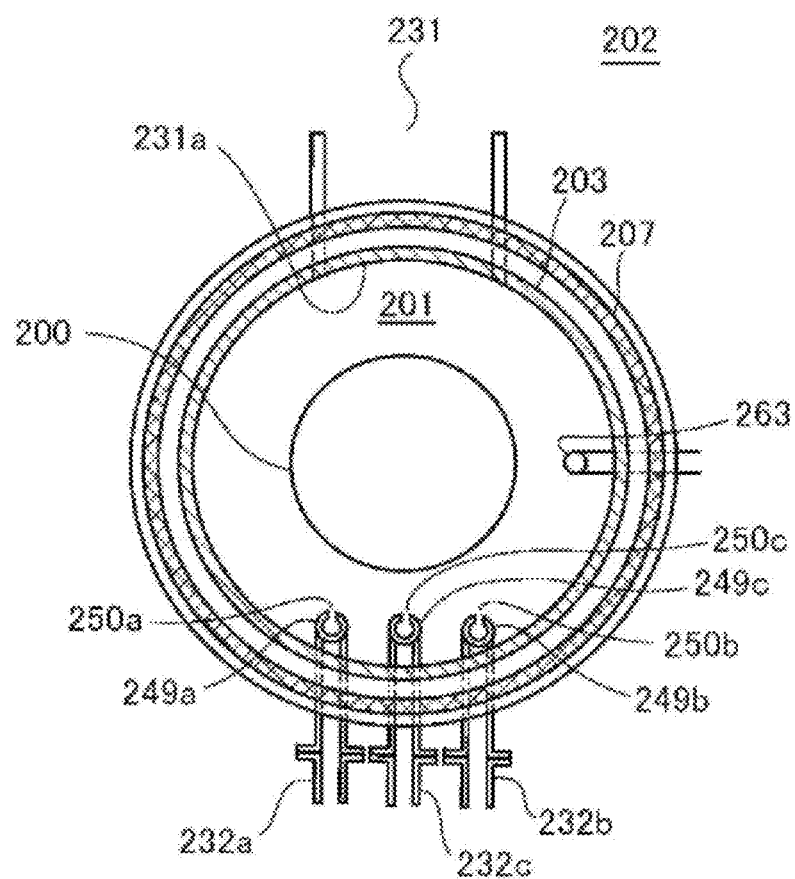
FIG. 2 is a schematic configuration view of the vertical process furnace of the substrate processing apparatus suitably used in some embodiments of the present disclosure, in which a portion of the process furnace is shown in a cross section taken along line A-A in FIG. 1.

As illustrated in FIG. 2, each of the nozzles 249a to 249c is disposed in an annular space, when seen in a plane view, between an inner wall of the reaction tube 203 and the wafers 200 so as to extend upward along an arrangement direction of the wafers 200 from a lower portion to an upper portion of the inner wall of the reaction tube 203. Specifically, each of the nozzles 249a to 249c is installed in a region horizontally surrounding a wafer arrangement region in which the wafers 200 are arranged at a lateral side of the wafer arrangement region, along the wafer arrangement region. In a plane view, the nozzle 249c is disposed so as to face an exhaust port 231a to be described below in a straight line with centers of the wafers 200 loaded into the process chamber 201 interposed therebetween. The nozzles 249a and 249b are arranged adjacent to the nozzle 249c with a straight line passing through the nozzle 249c and the exhaust port 231a interposed therebetween. In other words, the nozzles 249a and 249b are arranged on both sides of the nozzle 249c with the nozzle 249c interposed therebetween, that is, so as to sandwich the nozzle 249c between both sides along the inner wall of the reaction tube 203 (the outer peripheral portion of the wafers 200). Gas ejecting holes 250a to 250c configured to eject a gas are formed on side surfaces of the nozzles 249a to 249c, respectively. Each of the gas ejecting holes 250a to 250c is opened to oppose (face) the exhaust port 231a in a plane view to allow the gas to be supplied toward the wafers 200. A plurality of gas ejecting holes 250a to 250c may be formed from a lower portion to an upper portion of the reaction tube 203.

An oxygen (O)-containing gas is supplied from the gas supply pipes 232a and 232b into the process chamber 201 via the MFCs 241a and 241b, the valves 243a and 243b, and the nozzles 249a and 249b. The O-containing gas acts as an oxidation source (oxidizing agent or oxidizing gas), that is, an O source. As the O-containing gas, for example, an oxygen (02) gas can be used.

A hydrogen (H)-containing gas is supplied from the gas supply pipes 232d and 232e into the process chamber 201 via the MFCs 241d and 241e, the valves 243d and 243e, the gas supply pipes 232a and 232b, and the nozzles 249a and 249b. The H-containing gas does not have an oxidizing action by itself, but it reacts with the O-containing gas under specific conditions in a substrate processing process to be described below to generate oxidizing species such as atomic oxygen (O) or the like, which acts to improve the efficiency of oxidation reaction. As the H-containing gas, for example, a hydrogen ($H_2$) gas can be used.

A precursor gas, for example, a halosilane precursor gas containing silicon (Si) as a main element forming a film to be formed and a halogen element, is supplied from the gas supply pipe 232c into the process chamber 201 via the MFC 241c, the valve 243c, and the nozzle 249c. The precursor gas is a precursor in a gas state, for example, a gas obtained by vaporizing a precursor in a liquid state under normal temperature and normal pressure, a precursor in a gaseous state under normal temperature and normal pressure, or the like. The halosilane precursor refers to a silane precursor having a halogen group. The halogen group includes a halogen element such as chlorine (Cl), fluorine (F), bromine (Br), iodine (I), or the like. As the halosilane precursor gas, for example, a precursor gas containing Si and Cl, that is, a chlorosilane precursor gas, can be used. The chlorosilane precursor gas acts as a Si source. As the chlorosilane precursor gas, for example, a hexachlorodisilane ($Si_2Cl_6$, abbreviation: HCDS) gas can be used.

An inert gas, for example, a nitrogen ($N_2$) gas, is supplied from the gas supply pipes 232f to 232h into the process chamber 201 via the MFCs 241f to 241h, the valves 243f to 243h, the gas supply pipes 232a to 232c, and the nozzles 249a to 249c, respectively. The $N_2$ gas acts as a purge gas or a carrier gas.

An O-containing gas supply system mainly includes the gas supply pipes 232a and 232b, the MFCs 241a and 241b, and the valves 243a and 243b. A H-containing gas supply system mainly includes the gas supply pipes 232d and 232e, the MFCs 241d and 241e, and the valves 243d and 243e. A precursor gas supply system mainly includes the gas supply pipe 232c, the MFC 241c, and the valve 243c. An inert gas supply system mainly includes the gas supply pipes 232f to 232h, the MFCs 241f to 241h, and the valves 243f and 243h.

One or all of the above-described various supply systems may be configured as an integrated-type supply system 248 in which the valves 243a to 243h, the MFCs 241a to 241h and so on are integrated. The integrated-type supply system 248 is connected to each of the gas supply pipes 232a to 232h. In addition, the integrated-type supply system 248 may be configured such that operations of supplying various gases into the gas supply pipes 232a to 232h (that is, the opening/closing operation of the valves 243a to 243h, the flow rate adjustment operation by the MFCs 241a to 241h, and the like) are controlled by a controller 121 which will be described below. The integrated-type supply system 248 is configured as an integral type or detachable-type integrated unit, and may be attached to and detached from the gas supply pipes 232a to 232h and the like on an integrated unit basis, so that the maintenance, replacement, extension, and the like of the integrated-type supply system 248 can be performed on an integrated unit basis.

The exhaust port 231a configured to exhaust the internal atmosphere of the process chamber 201 is installed below the sidewall of the reaction tube 203. As illustrated in FIG. 2, in a plane view, the exhaust port 231a is installed at a position opposing (facing) the nozzles 249a to 249c (the gas ejecting holes 250a to 250c) with the wafers 200 interposed therebetween. The exhaust port 231a may be installed from a lower portion to an upper portion of the sidewall of the reaction tube 203, that is, along the wafer arrangement region. An exhaust pipe 231 is connected to the exhaust port 231a. A vacuum pump 246 as a vacuum exhaust device is connected to the exhaust pipe 231 via a pressure sensor 245, which is a pressure detector (pressure detecting part) configured to detect the internal pressure of the process chamber 201, and an auto pressure controller (APC) valve 244, which is a pressure regulator (pressure adjustment part). The APC valve 244 is configured to be capable of performing or stopping a vacuum exhausting operation in the process chamber 201 by opening/closing the valve while the vacuum pump 246 is actuated, and is also configured to be capable of adjusting the internal pressure of the process chamber 201 by adjusting an opening degree of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening cover configured to be capable of hermetically sealing a lower end opening of the manifold 209, is installed under the manifold 209. The seal cap 219 is made of, for example, a metal material such as stainless steel (SUS) or the like, and is formed in a disc shape. An O-ring 220b, which is a seal member making contact with the lower end portion of the manifold 209, is installed at an upper surface of the seal cap 219. A rotation mechanism 267 configured to rotate a boat 217, which will be described below, is installed under the seal cap 219. A rotary shaft 255 of the rotation mechanism 267 is connected to the boat 217 via the seal cap 219. The rotation mechanism 267 is configured to rotate the wafers 200 by rotating the boat 217. The seal cap 219 is configured to be vertically moved up or down by a boat elevator 115, which is an elevating mechanism installed outside the reaction tube 203. The boat elevator 115 is configured as a transfer device (transfer mechanism) configured to load/unload (transfers) the wafers 200 into/out of the process chamber 201 by moving the seal cap 219 up or down. A shutter 219s, which serves as a furnace opening cover configured to be capable of hermetically sealing a lower end opening of the manifold 209 in a state where the seal cap 219 is lowered and the boat 217 is unloaded from the process chamber 201, is installed under the manifold 209. The shutter 219s is made of, for example, a metal material such as stainless steel (SUS) or the like, and is formed in a disc shape. An O-ring 220c, which is a seal member making contact with the lower end portion of the manifold 209, is installed at an upper surface of the shutter 219s. The opening/closing operation (such as elevation operation, rotation operation, or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of a heat resistant material such as quartz or SiC. Heat insulating plates 218 made of a heat resistant material, such as quartz or SiC, are installed below the boat 217 in multiple stages.

A temperature sensor 263 serving as a temperature detector is installed at the reaction tube 203. Based on temperature information detected by the temperature sensor 263, a state of supplying electric power to the heater 207 is adjusted such that an interior of the process chamber 201 has a desired temperature distribution. The temperature sensor 263 is installed along the inner wall of the reaction tube 203.

Figure 3:
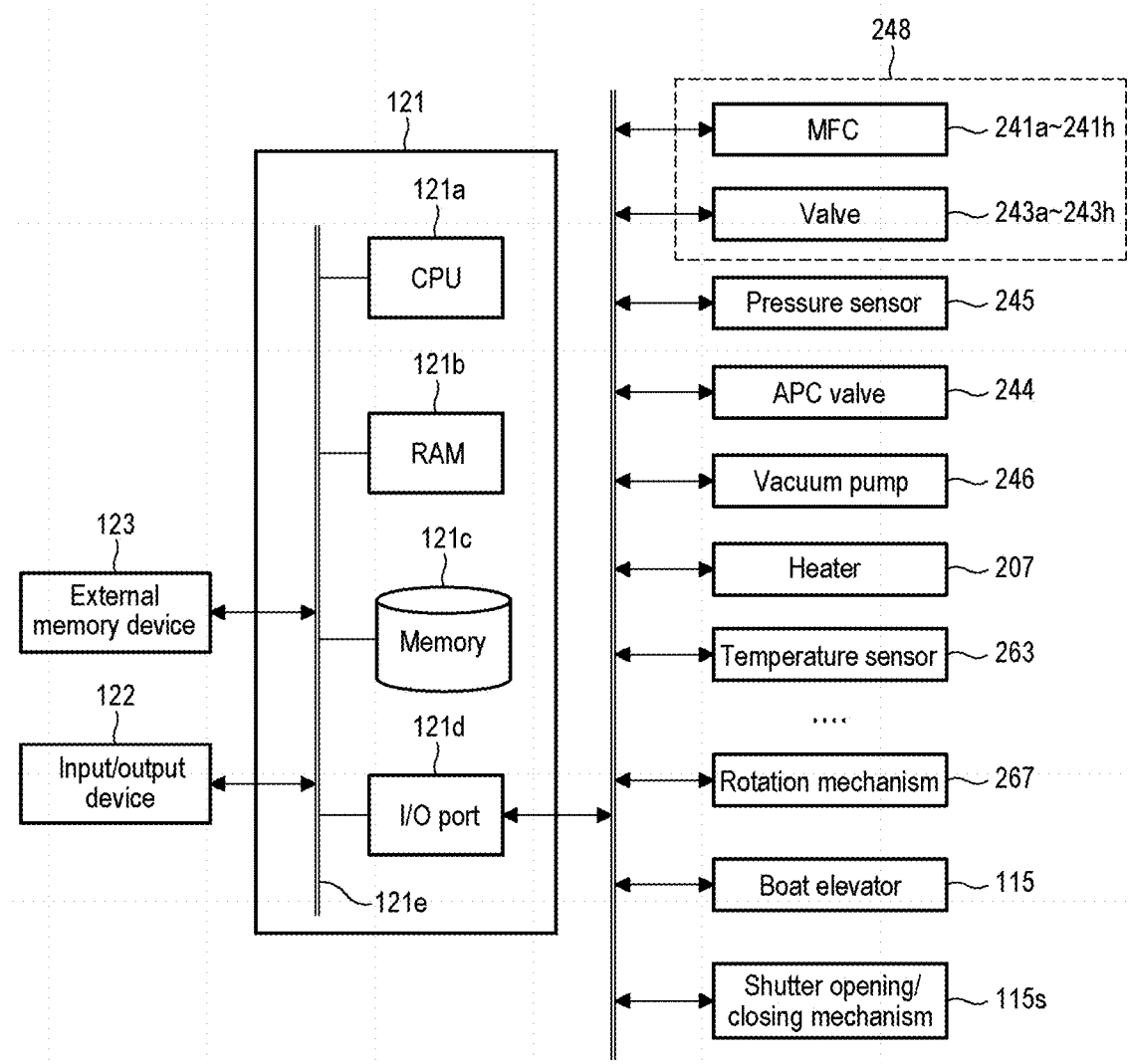
FIG. 3 is a schematic configuration diagram of a controller of the substrate processing apparatus suitably used in some embodiments of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c, and the I/O port 121d are configured to be capable of exchanging data with the CPU 121a via an internal bus 121e. An input/output device 122 configured as, for example, a touch panel or the like, is connected to the controller 121.

The memory device 121c includes, for example, a flash memory, a hard disk drive (HDD), or the like. A control program that controls operations of a substrate processing apparatus, a process recipe in which sequences and conditions of substrate processing to be described below are written, and the like, are readably stored in the memory device 121c. The process recipe functions as a program configured to be capable of causing the controller 121 to execute each sequence in the substrate processing, which will be described below, to obtain an expected result. Hereinafter, the process recipe and the control program may be generally and simply referred to as a "program." Furthermore, the process recipe may be simply referred to as a "recipe." When the term "program" is used herein, it may indicate a case of including the recipe only, a case of including the control program only, or a case of including both the recipe and the control program. The RAM 121b is configured as a memory area (work area) in which a program or data read by the CPU 121a is temporarily stored.

The I/O port 121d is connected to the MFCs 241a to 241h, the valves 243a to 243h, the pressure sensor 245, the APC valve 244, the vacuum pump 246, the temperature sensor 263, the heater 207, the rotation mechanism 267, the boat elevator 115, the shutter opening/closing mechanism 115s, and so on.

The CPU 121a is configured to read and execute the control program from the memory device 121c. The CPU 121a also reads the recipe from the memory device 121c according to an input of an operation command from the input/output device 122. In addition, the CPU 121a is configured to control the flow rate adjusting operation of various kinds of gases by the MFCs 241a to 241h, the opening/closing operation of the valves 243a to 243h, the opening/closing operation of the APC valve 244, the pressure adjusting operation performed by the APC valve 244 based on the pressure sensor 245, the actuating and stopping operation of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up or down by the boat elevator 115, the opening/closing operation of the shutter 219s by the shutter opening/closing mechanism 115s, and so on, according to contents of the read recipe.

The controller 121 may be configured by installing, on the computer, the aforementioned program stored in an external memory device 123. Examples of the external memory device 123 may include a magnetic disk such as an HDD, an optical disc such as a CD, a magneto-optical disc such as an MO, a semiconductor memory such as a USB memory, and the like. The memory device 121c or the external memory device 123 is configured as a computer-readable recording medium. Hereinafter, the memory device 121c and/or the external memory device 123 may be generally and simply referred to as a "recording medium." When the term "recording medium" is used herein, it may indicate a case of including the memory device 121c only, a case of including the external memory device 123 only, or a case of including both the memory device 121c and the external memory device 123. Furthermore, the program may be provided to the computer by using communication means such as the Internet or a dedicated line, instead of using the external memory device 123.

(2) Substrate Processing Process

As a process of manufacturing a semiconductor device by using the above-described substrate processing apparatus, a substrate processing sequence example of forming a film on a wafer 200 as a substrate, that is, a film-forming sequence example, will be described with reference to FIG. 4. In the following descriptions, operations of the respective parts constituting the substrate processing apparatus are controlled by the controller 121.

Figure 4:
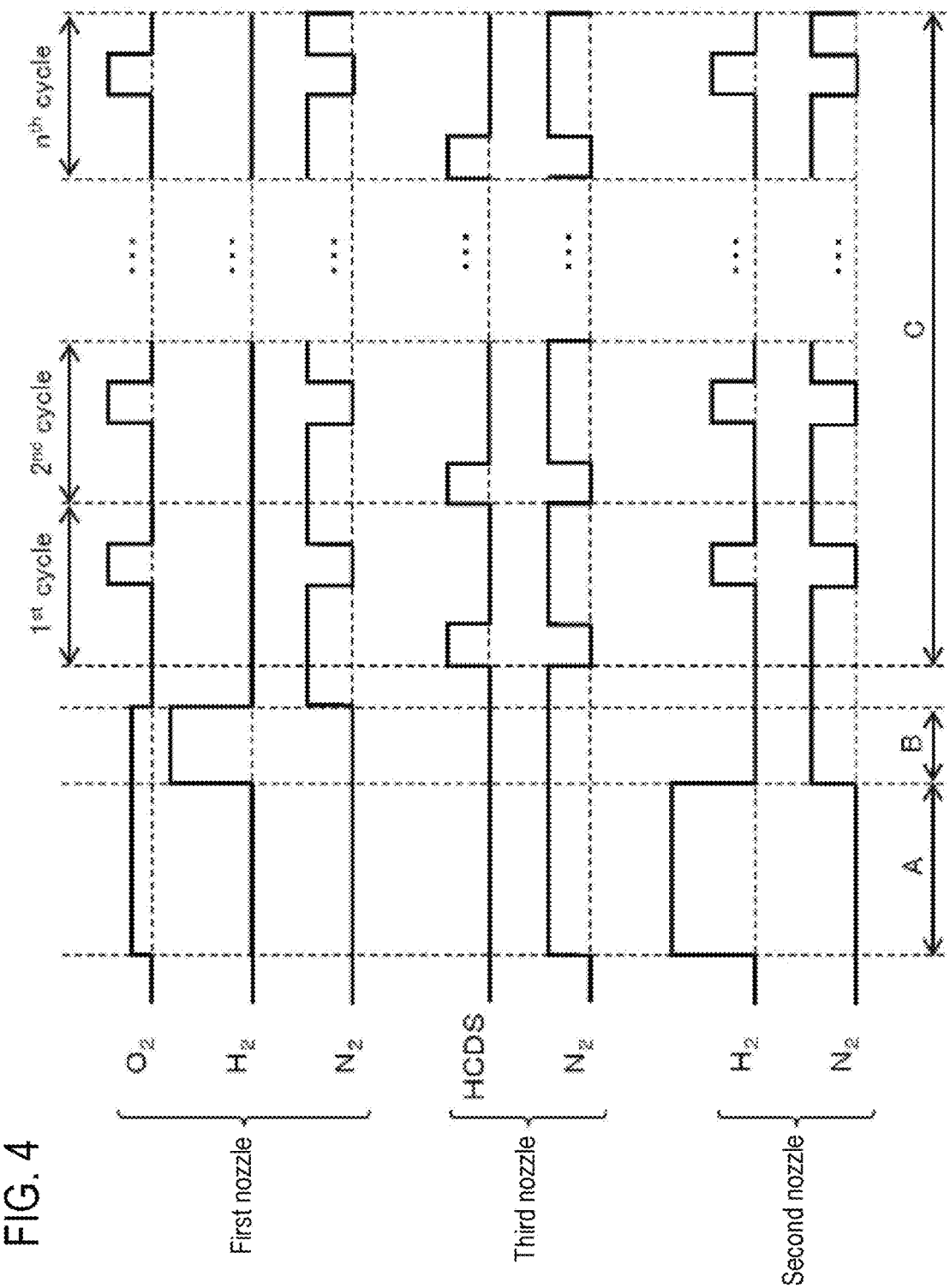
FIG. 4 is a diagram showing a film-forming sequence according to some embodiments of the present disclosure.

The film-forming sequence shown in FIG. 4 includes:

a step (pretreatment step) of forming an initial oxide layer on the surface of a wafer 200 by performing a set m times (where m is an integer equal to or greater than 1), the set including non-simultaneously performing:

a step A of oxidizing the surface of the wafer 200 under a condition that an oxidation amount of the wafer 200 increases from the upstream side to the downstream side of the gas flow by supplying an $O_2$ gas as an O-containing gas and a $H_2$ gas as a H-containing gas to the wafer 200; and a step B of oxidizing the surface of the wafer 200 under a condition that the oxidation amount of the wafer 200 decreases from the upstream side to the downstream side of the gas flow by supplying the $O_2$ gas as the O-containing gas and the $H_2$ gas as the H-containing gas to the wafer 200; and a step C (film-forming step) of forming a film on the initial oxide layer by supplying a HCDS gas as a precursor gas to the wafer 200.

In the film-forming step, a film containing Si and O, that is, a silicon oxide film (SiO film), is formed as the film on the initial oxide layer by performing a cycle n times (where n is an integer equal to or greater than 1), the cycle including non-simultaneously performing: a step C1 of supplying a HCDS gas as a precursor gas to the wafer 200; and a step C2 of supplying an $O_2$ gas as an O-containing gas and a $H_2$ gas as a H-containing gas to the wafer 200.

In the present disclosure, for the sake of convenience, the film-forming sequence shown in FIG. 4 may be denoted as follows. The same denotation may be used in modifications and other embodiments to be described below.

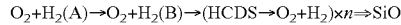

$O_2+H_2(A) \rightarrow O_2+H_2(B) \rightarrow (HCDS \rightarrow O_2+H_2) \times n \Rightarrow SiO$ When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer and the like formed on a wafer". When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

(Wafer Charging and Boat Loading)

The boat 217 is charged with a plurality of wafers 200 (wafer charging). Thereafter, as illustrated in FIG. 1, the boat 217 charged with the plurality of wafers 200 is lifted up by the boat elevator 115 to be loaded into the process chamber 201 (boat loading). In this state, the seal cap 219 seals the lower end of the manifold 209 via the O-ring 220b.

(Pressure Adjustment and Temperature Adjustment)

The interior of the process chamber 201, that is, a space where the wafers 200 are placed, is vacuum-exhausted (decompression-exhausted) by the vacuum pump 246 to reach a desired pressure (processing pressure). At this time, the internal pressure of the process chamber 201 is measured by the pressure sensor 245, and the APC valve 244 is feedback-controlled based on the measured pressure information. Further, the wafers 200 in the process chamber 201 are heated by the heater 207 so as to have a desired temperature (processing temperature). At this time, the state of supplying electric power to the heater 207 is feedback-controlled based on the temperature information detected by the temperature sensor 263 so that the interior of the process chamber 201 has a desired temperature distribution. Further, the rotation of the wafers 200 by the rotation mechanism 267 is started. The exhaust of the interior of the process chamber 201 and the heating and rotation of the wafers 200 are continuously performed at least until the processing on the wafers 200 is completed.

(Pretreatment Step)

After that, the following steps A and B are sequentially executed.

[Step A]

In this step, an $O_2$ gas and a $H_2$ gas are simultaneously supplied into the process chamber 201 accommodating the wafers 200 via the nozzles 249a and 249b which are separate supply parts, and these gases are mixed in the process chamber 201 ($O_2$ gas+$H_2$ gas supply by Post-mix).

Specifically, the valves 243a and 243e are opened, and the $O_2$ gas and the $H_2$ gas are flown into the gas supply pipes 232a and 232e, respectively. The flow rates of the $O_2$ gas and the $H_2$ gas are adjusted by the MFCs 241a and 241e, respectively, and the $O_2$ gas and the $H_2$ gas are separately and simultaneously supplied into the process chamber 201 via the gas supply pipes 232a and 232b and the nozzles 249a and 249b. The $O_2$ gas and the $H_2$ gas supplied into the process chamber 201 are diffused in the wafer arrangement region, mixed with each other in the course, and then exhausted from the exhaust pipe 231 via the exhaust port 231a. In this operation, the $O_2$ gas and the $H_2$ gas are simultaneously and together supplied to the wafers 200. At this time, the valve 243h is opened, and a $N_2$ gas is flown into the gas supply pipe 232h. The flow rate of the $N_2$ gas is adjusted by the MFC 241h, and the $N_2$ gas is supplied into the process chamber 201 via the gas supply pipe 232c and the nozzle 249c and is exhausted from the exhaust pipe 231 via the exhaust port 231a. The supply of the $N_2$ gas from the nozzle 249c may not be performed.

The $O_2$ gas and the $H_2$ gas, which are supplied into the process chamber 201 via the nozzles 249a and 249b and mixed with each other, are thermally-activated (excited) and react with each other in a heated and depressurized non-plasma atmosphere, thereby generating moisture ($H_2O$)-free oxidizing species containing oxygen such as atomic oxygen (O). Then, the surface of the wafers 200 is oxidized mainly by the oxidizing species. As a result, an O diffusion layer, that is, a silicon oxide layer (SiO layer), is formed on the surface of the wafers 200. According to this oxidation treatment, it becomes possible to significantly improve an oxidizing power as compared with a case of supplying the $O_2$ gas alone or a case of supplying the $H_2O$ gas (water vapor) alone. That is, by adding the $H_2$ gas to the $O_2$ gas under a depressurized atmosphere, the oxidizing power may be improved significantly as compared with the case of supplying the $O_2$ gas alone or the case of supplying the $H_2O$ gas alone. This same applies to the step B and the step C2 in the film-forming step, which will be described below.

As described above, in this step, the $O_2$ gas and the $H_2$ gas are supplied into the process chamber 201 by the Post-mix. In this case, the generation of the oxidizing species by the reaction of the $O_2$ gas and the $H_2$ gas is started after these gases are mixed in the process chamber 201, that is, after a predetermined time elapses after these gases are supplied into the process chamber 201. In the step A, the generation of the oxidizing species by the reaction of the $O_2$ gas and the $H_2$ gas tends to become more active at the downstream side of the gas flow including a lower portion of the wafer arrangement region than at the upstream side of the gas flow including an upper portion of the wafer arrangement region. As a result, in the step A, concentration (production amount) of the oxidizing species at the downstream side of the gas flow becomes higher (more) than concentration (production amount) of the oxidizing species at the upstream side of the gas flow. Therefore, in the step A, the amount of oxidation on the surface of the wafers 200 gradually increases from the upstream side to the downstream side of the gas flow, that is, from the upper portion to the lower portion of the wafer arrangement region.

After a predetermined time has passed, the valve 243e is closed, the supply of the $H_2$ gas into the process chamber 201 via the nozzle 249b is stopped, and step B to be described below is started. At this time, the valve 243a is kept open and the supply of the $O_2$ gas into the process chamber 201 via the nozzle 249a is continued without being stopped. That is, the step A and the step B to be described below are continuously performed without purging the interior of the process chamber 201 between the steps A and B.

[Step B]

In this step, an $O_2$ gas and a $H_2$ gas are supplied into the process chamber 201 accommodating the wafers 200 at the same time via the nozzle 249a, which is the same supply part, that is, the $O_2$ gas and the $H_2$ gas are pre-mixed in the same supply part and supplied (02 gas+$H_2$ gas supply by Pre-mix).

Specifically, with the valve 243a opened, the valve 243d is opened to allow the $H_2$ gas to flow through the gas supply pipe 232d while allowing the $O_2$ gas to flow through the gas supply pipe 232a. The flow rates of the $O_2$ gas and the $H_2$ gas are adjusted by the MFCs 241a and 241d, respectively, and the $O_2$ gas and the $H_2$ gas are mixed with each other in the gas supply pipe 232a and the nozzle 249a and are simultaneously supplied into the process chamber 201 via the nozzle 249a. The $O_2$ gas and the $H_2$ gas supplied into the process chamber 201 diffuse in the wafer arrangement region in a mixed state, and then are exhausted from the exhaust pipe 231 via the exhaust port 231a. In this operation, the $O_2$ gas and the $H_2$ gas are simultaneously and together supplied to the wafers 200. At this time, the valves 243g and 243h are opened to allow a $N_2$ gas to flow through the gas supply pipes 232g and 232h, respectively. The flow rate of the $N_2$ gas is adjusted by the MFCs 241g and 241h, and the $N_2$ gas is supplied into the process chamber 201 via the gas supply pipes 232b and 232c and the nozzles 249b and 249c and is exhausted from the exhaust pipe 231 via the exhaust port 231a. The supply of the $N_2$ gas from the nozzles 249b and 249c may not be performed.

The $O_2$ gas and the $H_2$ gas pre-mixed in the gas supply pipe 232a and the nozzle 249a are thermally-activated and react with each other in a heated and depressurized non-plasma atmosphere, thereby generating the above-mentioned oxidizing species containing oxygen such as atomic oxygen. Then, an oxidation process is further performed mainly by the oxidizing species on the surface of the wafers 200 oxidized in the step A. As a result, the SiO layer formed on the surface of the wafers 200 further grows.

As described above, in this step, the $O_2$ gas and the $H_2$ gas are supplied into the process chamber 201 by Pre-mix. In this case, the generation of the oxidizing species by the reaction of the $O_2$ gas and the $H_2$ gas can be started after these gases are mixed in the gas supply pipe 232a, that is, after a predetermined time elapses after these gases pass through the gas supply pipe 232a. That is, the generation of the oxidizing species by the reaction of the $O_2$ gas and the $H_2$ gas may be started before these gases are supplied into the process chamber 201, for example, in the course in which these gases flow through the heated nozzle 249a. In addition, the generation of the oxidizing species by the reaction of the $O_2$ gas and the $H_2$ gas may be started quickly after these gases are supplied into the process chamber 201, or may be started within a relatively short time after these gases are supplied into the process chamber 201. In any case, in the step B, the generation of the oxidizing species by the reaction of the $O_2$ gas and the $H_2$ gas tends to become more active at the upstream side of the gas flow including the upper portion of the wafer arrangement region than at the downstream side of the gas flow including the lower portion of the wafer arrangement region. As a result, in the step B, the concentration (production amount) of the oxidizing species at the upstream side of the gas flow becomes higher (more) than the concentration (production amount) of the oxidizing species at the downstream side of the gas flow. Therefore, in the step B, the amount of oxidation on the surface of the wafers 200 gradually decreases from the upstream side to the downstream side of the gas flow, that is, from the upper portion to the lower portion of the wafer arrangement region.

After a predetermined time has elapsed, the valves 243a and 243d are closed to stop the supply of the $O_2$ gas and the $H_2$ gas into the process chamber 201 via the nozzle 249a. Further, when performing the set described below multiple times, that is, two or more times, the valve 243a is kept open, and the valve 243d is closed to stop the supply of the $H_2$ gas while continuing the supply of the $O_2$ gas into the process chamber 201 via the nozzle 249a.

[Performing Predetermined Number of Times]

By performing a set one or more times (m times), the set including non-simultaneously, that is, without synchronization, performing the steps A and B, it is possible to form a SiO layer having a predetermined thickness as an initial oxide layer on the surface of the wafers 200. FIG. 4 shows a case where the above-mentioned set is performed once.

As described above, the amount of oxidation on the surface of the wafers 200 in the step A gradually increases from the upstream side to the downstream side of the gas flow. If only the step A is performed and the step B is not performed in the pretreatment step, the thickness (depth) of the SiO layer formed on the surface of the wafers 200 has a strong tendency to gradually thicker (deeper) from the upstream side to the downstream side of the gas flow, that is, from the upper portion to the lower portion of the wafer arrangement region.

Further, as described above, the amount of oxidation on the surface of the wafers 200 in the step B gradually decreases from the upstream side to the downstream side of the gas flow. If the step A is not performed and only the step B is performed in the pretreatment step, the thickness (depth) of the SiO layer formed on the surface of the wafers 200 has a strong tendency to gradually thinner (shallower) from the upstream side to the downstream side of the gas flow, that is, from the upper portion to the lower portion of the wafer arrangement region.

On the other hand, in the pretreatment step of the present embodiment, since both the steps A and B are performed as a set, a tendency of an inter-wafer thickness distribution of the SiO layer formed by performing the step A may be canceled by a tendency of an inter-wafer thickness distribution of the SiO layer formed by performing the step B. According to the present embodiment, it is possible to make the amount of oxidation on the surface of the wafers 200 uniform from the upstream side to the downstream side of the gas flow, that is, from the upper portion to the lower portion of the wafer arrangement region. That is, it is possible to improve an inter-wafer thickness uniformity of the initial oxide layer formed on the surface of the wafers 200.

After the initial oxide layer having a desired thickness is formed on the surface of the wafers 200, the interior of the process chamber 201 is vacuum-exhausted to remove a gas and the like remaining in the process chamber 201 from the interior of the process chamber 201. At this time, the valves 243*f* to 243*h* are opened to supply a $N_2$ gas into the process chamber 201. The $N_2$ gas acts as a purge gas, whereby the interior of the process chamber 201 is purged (purge step).

The process conditions in the step A are exemplified as follows.

$O_2$ gas supply flow rate: 100 to 10,000 sccm $H_2$ gas supply flow rate: 200 to 20,000 sccm $N_2$ gas supply flow rate (for each gas supply pipe): 0 to 10,000 sccm $O_2$ gas and $H_2$ gas supply time: 2 to 240 seconds, specifically 4 to 120 seconds in some embodiments Processing temperature: 350 to 800 degrees C., specifically 400 to 700 degrees C. in some embodiments Processing pressure: 13.3 to 1,333 Pa, specifically 13.3 to 399 Pa in some embodiments The process conditions in the step B are exemplified as follows.

$O_2$ gas and $H_2$ gas supply time: 1 to 120 seconds, specifically 2 to 60 seconds in some embodiments Other process conditions are the same as the process conditions in the step A.

In the present disclosure, the notation of a numerical range such as "350 to 800 degrees C." means that the lower limit value and the upper limit value are included in the range. For example, "350 to 800 degrees C." means "equal to or larger than 350 degrees C. and equal to or smaller than 800 degrees C." The same applies to other numerical ranges.

As the O-containing gas, in addition to the $O_2$ gas, it may be possible to use an O-containing gas such as a nitrous oxide ($N_2O$) gas, a nitric oxide (NO) gas, a nitrogen dioxide ($NO_2$) gas, an ozone ($O_3$) gas, a $H_2O$ gas, a carbon monoxide (CO) gas, a carbon dioxide ($CO_2$) gas, or the like. The O-containing gas used in the step A and the O-containing gas used in the step B may be the same or different.

As the H-containing gas, in addition to the $H_2$ gas, it may be possible to use a H-containing gas such as a deuterium ($D_2$) gas or the like. The H-containing gas used in the step A and the H-containing gas used in the step B may be the same or different.

As the inert gas, in addition to the $N_2$ gas, it may be possible to use, for example, a rare gas such as an Ar gas, a He gas, a Ne gas, a Xe gas, or the like. This applies to the film-forming step to be described below.

(Film-Forming Step)

After the purge of the interior of the process chamber 201 is completed, the following steps C1 and C2 are sequentially executed.

[Step C1]

In this step, a HCDS gas is supplied to the wafers 200 in the process chamber 201, that is, the wafers 200 having the initial oxide layer formed on its surface.

Specifically, the valve 243*c* is opened to allow the HCDS gas to flow through the gas supply pipe 232*c*. The flow rate of the HCDS gas is adjusted by the MFC 241*c*, and the HCDS gas is supplied into the process chamber 201 via the nozzle 249*c*, diffuses in the wafer arrangement region, and is then exhausted from the exhaust pipe 231 via the exhaust port 231*a*. In this operation, the HCDS gas is supplied to the wafers 200. At this time, the valves 243*f* and 243*g* are opened to allow a $N_2$ gas flow through the gas supply pipes 232*f* and 232*g*, respectively. The flow rate of the $N_2$ gas is adjusted by the MFCs 241*f* and 241*g*, and the $N_2$ gas is supplied into the process chamber 201 via the gas supply pipes 232*a* and 232*b* and the nozzles 249*a* and 249*b* and is exhausted from the exhaust pipe 231 via the exhaust port 231*a*. The supply of the $N_2$ gas from the nozzles 249*a* and 249*b* may not be performed.

By supplying the HCDS gas to the wafers 200, a Si-containing layer (first layer) containing Cl is formed on the surface of the wafers 200, that is, on the initial oxide layer. The Si-containing layer containing Cl is formed by physical adsorption of HCDS on the surface of the wafers 200, chemical adsorption of a substance obtained by partially decomposing HCDS, deposition of Si by thermal decomposition of HCDS, and the like. That is, the Si-containing layer containing Cl may be an adsorption layer (physical adsorption layer or chemical adsorption layer) of HCDS or a substance obtained by partially decomposing HCDS, or may be a deposition layer of Si containing Cl (Si layer). Hereinafter, the Si-containing layer containing Cl is also simply referred to as a Si-containing layer.

After forming the Si-containing layer on the wafers 200, the valve 243*c* is closed to stop the supply of the HCDS gas into the process chamber 201. Then, a gas and the like remaining in the process chamber 201 are removed from the process chamber 201 by the same processing procedure and process conditions as in the purge step of the pretreatment step.

[Step C2]

After the step C1 is completed, an $O_2$ gas and a $H_2$ gas are simultaneously and together supplied to the wafers 200, that is, the Si-containing layer formed on the wafers 200, in the process chamber 201. The processing procedure at this time is, for example, the same as the processing procedure in the step A of the preprocessing step. That is, in this step, the valves 243*a* and 243*e* are opened to simultaneously supply the $O_2$ gas and the $H_2$ gas into the process chamber 201 via the nozzles 249*a* and 249*b*, respectively.

By supplying the $O_2$ gas and the $H_2$ gas to the wafers 200 simultaneously and together, the Si-containing layer formed on the wafers 200 in the step C1 is oxidized by the above-mentioned oxidizing species containing oxygen such as atomic oxygen generated by the reaction of these gases. Since the energy of this oxidizing species is higher than a bonding energy of a Si—Cl bond or the like contained in the Si-containing layer, the Si—Cl bond or the like contained in the Si-containing layer is cut by applying the energy of this oxidizing species to the Si-containing layer. Cl and the like whose bonding with Si is cut are removed from the layer and are discharged as $Cl_2$, HCl and the like. In addition, a bonding hand of Si left after the bonding with Cl and the like is broken, is bonded to O contained in the oxidizing species to form a Si—O bond. In this way, the Si-containing layer is changed (modified) to a layer containing Si and O and having the low contents of impurities such as Cl, that is, a high-purity SiO layer (second layer).

After changing the Si-containing layer to the SiO layer, the valves 243*a* and 243*e* are closed to stop the supply of the $O_2$ gas and the $H_2$ gas into the process chamber 201, respectively. Then, a gas and the like remaining in the process chamber 201 are removed from the process chamber 201 by the same processing procedure and process conditions as in the purge step of the pretreatment step.

[Performing Predetermined Number of Times]

By performing a cycle one or more times (n times), the cycle including non-simultaneously, that is, without synchronization, performing the steps C1 and C2, it is possible to form (deposit) a SiO film having a desired film thickness on the initial oxide layer formed on the surface of the wafers 200. This cycle may be repeated multiple times. That is, the thickness of the SiO layer formed per one cycle may be set to be smaller than a desired film thickness, and the above cycle may be repeated multiple times until the film thickness of the SiO film formed by laminating the SiO layers becomes equal to the desired film thickness in some embodiments.

The process conditions in the step C1 are exemplified as follows.

HCDS gas supply flow rate: 5 to 2,000 sccm, specifically 50 to 1,000 sccm in some embodiments HCDS gas supply time: 1 to 120 seconds, specifically 1 to 60 seconds in some embodiments $N_2$ gas supply flow rate (for each gas supply pipe): 0 to 10,000 sccm Processing temperature: 350 to 800 degrees C., specifically 400 to 700 degrees C. in some embodiments Processing pressure: 1 to 2,666 Pa, specifically 67 to 1,333 Pa in some embodiments The process conditions in the step C2 are exemplified as follows.

$O_2$ gas supply flow rate: 100 to 10,000 sccm $H_2$ gas supply flow rate: 100 to 10,000 sccm $O_2$ gas and $H_2$ gas supply time: 1 to 100 seconds, specifically 1 to 50 seconds in some embodiments Processing temperature: 350 to 800 degrees C., specifically 400 to 700 degrees C. in some embodiments Processing pressure: 13.3 to 1,333 Pa, specifically 13.3 to 399 Pa in some embodiments Other process conditions are the same as the process conditions in the step C1.

As the precursor gas, in addition to the HCDS gas, it may be possible to use a chlorosilane precursor gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, an octachlorotrisilane ($Si_3Cl_8$, abbreviation: OCTS) gas, or the like.

As the O-containing gas, in addition to the $O_2$ gas, it may be possible to use the above-mentioned various O-containing gases. The O-containing gas used in the step C2 and the O-containing gas used in the steps A and B may be the same or different.

As the H-containing gas, in addition to the $H_2$ gas, it may be possible to use a $D_2$ gas. The H-containing gas used in the step C2 and the H-containing gas used in the steps A and B may be the same or different.

(After-Purge and Returning to Atmospheric Pressure)

After the film-forming step is completed, a $N_2$ gas is supplied into the process chamber 201 from each of the gas supply pipes 232f to 232h and is exhausted from the exhaust pipe 231 via the exhaust port 231a. The $N_2$ gas acts as a purge gas. Thus, the interior of the process chamber 201 is purged and residual gas and reaction byproducts remaining in the process chamber 201 are removed from the interior of the process chamber 201 (after-purge). Thereafter, the internal atmosphere of the process chamber 201 is substituted with an inert gas (inert gas substitution) and the internal pressure of the process chamber 201 is returned to the atmospheric pressure (returning to atmospheric pressure).

(Boat Unloading and Wafer Discharging)

The seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After being unloaded from the reaction tube 203, the processed wafers 200 are discharged from the boat 217 (wafer discharging).

(3) Effects of the Present Embodiment

According to the present embodiment, one or more effects set forth below may be achieved.

(a) In the pretreatment step, by performing a set a predetermined number of times, the set including non-simultaneously performing: the step A of oxidizing the surface of the wafers 200 under a condition that an oxidation amount of the wafers 200 increases from the upstream side to the downstream side of the gas flow; and the step B of oxidizing the surface of the wafers 200 under a condition that the oxidation amount of the wafers 200 decreases from the upstream side to the downstream side of the gas flow, it is possible to improve the inter-wafer thickness uniformity of the initial oxide layer formed on the surface of the wafers 200. If a thickness distribution of the initial oxide layer formed on the surface of the wafers 200 in the pretreatment step can be made uniform among the wafers, thereafter, by performing the film-forming step, it is possible to make the film thickness of the SiO film formed on the wafers 200, that is, on the initial oxide layer, uniform among the wafers 200. That is, according to the present embodiment, it is possible to improve the inter-wafer film thickness uniformity of the SiO film formed on the wafers 200.

(b) In the pretreatment step, the steps A and B are performed in this order, and in the step B, while the supply of the $O_2$ gas from the nozzle 249a, which has been performed in the step A, continues without being stopped, it is possible to improve an efficiency of the pretreatment step by switching the nozzle, which supplies the $H_2$ gas, from the nozzle 249b to the nozzle 249a. That is, by continuously performing the steps A and B without purging the inside of the process chamber 201 between the step A and the step B, it is possible to shorten a total time required for the pretreatment steps, thereby improving a total productivity of the substrate processing process.

(c) In at least one of the steps A and B of the pretreatment step, by oxidizing the surface of the wafers 200 under a condition that the supply flow rate of the $H_2$ gas is higher than the supply flow rate of the $O_2$ gas, it is possible to properly suppressing an oxidation rate. This makes it possible to improve a controllability of an oxidation process, thereby improving a wafer in-plane thickness uniformity of the initial oxide layer formed on the surface of the wafers 200 and preventing excessive oxidation of the surface of the wafers 200. In both the steps A and B of the pretreatment step, it is possible to more reliably obtain the above-described effects by oxidizing the surface of the wafers 200 under the condition that the supply flow rate of the $H_2$ gas is higher than the supply flow rate of the $O_2$ gas.

(d) By making a supply time Ta of the $O_2$ gas and the $H_2$ gas in the step A longer than a supply time Tb of the $O_2$ gas and the $H_2$ gas in the step B (Ta>Tb), it is possible to improve the controllability of the oxidation process in the pretreatment step, thereby further improving the inter-wafer thickness uniformity of the initial oxide layer formed on the surface of the wafers 200.

Further, by making the above-mentioned supply time Tb longer than a supply duration time Tc of the $O_2$ gas and the $H_2$ gas (that is, a supply time for which the $O_2$ gas and the $H_2$ gas is being supplied) in the step C2 (Ta>Tb>Tc), it is possible to improve the controllability of the oxidation process in the pretreatment step, thereby further improving the inter-wafer thickness uniformity of the initial oxide layer formed on the surface of the wafers 200.

(e) According to the present embodiment, since the inter-wafer film thickness uniformity of the SiO film formed on the wafers 200 can be improved by the pretreatment step, the processing procedure and process conditions in the film-forming step may not be changed (fine-adjusted) to improve the inter-wafer thickness uniformity of the SiO film. That is, it is possible to improve the wafer-to-wafer thickness uniformity of the SiO film formed on the wafers 200 while maintaining a film quality having a good electrical characteristics of the SiO film formed by performing the film-forming step, without being damaged by a change of the process conditions and the like.

(f) By performing the purge step after performing a set a predetermined number of times, the set including non-simultaneously performing the steps A and B, in the pretreatment step, it is possible to avoid an unnecessary gas phase reaction in the process chamber 201 in the film-forming step performed subsequently, thereby improving a quality of a film-forming process.

(g) The above-described effects may also be obtained similarly even when the above-mentioned O-containing gases other than the $O_2$ gas are used, even when the above-mentioned H-containing gases other than the $H_2$ gas are used, even when the above-mentioned precursor gases other than the HCDS gas are used, or even when the above-mentioned inert gases other than the $N_2$ gas are used.

(4) Modifications

The present embodiment may be changed as the following modifications. These modifications can be arbitrarily combined. Unless otherwise specified, the processing procedure and process conditions in each step of each modification may be the same as the processing procedure and process conditions in each step of the film-forming sequence shown in FIG. 4.

(Modification 1)

In each set of the pretreatment step, the steps B and A may be performed in this order, and in the step A, while continuing the supply of the $O_2$ gas from the nozzle 249a, which has been performed in the step B, without being stopped, the nozzle, which supplies the $H_2$ gas, may be switched from the nozzle 249a to the nozzle 249b. That is, in the pretreatment step, a set including non-simultaneously performing the supply of the $O_2$ gas+$H_2$ gas by Pre-Mix via the nozzle 249a and the supply of the $O_2$ gas+$H_2$ gas by Post-Mix via the nozzles 249a and 249b in this order may be performed a predetermined number of times (m times). Even in the present modification, the same effects as the film-forming sequence shown in FIG. 4 can be obtained.

(Modification 2)

The $O_2$ gas may be supplied from the nozzle 249a and the $H_2$ gas may be supplied from the nozzle 249b in the step A, and the $O_2$ gas and the $H_2$ gas may be supplied from the nozzle 249b in the step B. That is, the supply of the $O_2$ gas+$H_2$ gas by Pre-Mix may be performed via the nozzle 249b instead of the nozzle 249a.

In each set of the pretreatment step of the present modification, the steps A and B may be performed in this order, and in the step B, while continuing the supply of the $H_2$ gas from the nozzle 249b, which has been performed in the step A, without being stopped, the nozzle that supplies the $O_2$ gas may be switched from the nozzle 249a to the nozzle 249b.

That is, in the pretreatment step, a set including non-simultaneously performing the supply of the $O_2$ gas+$H_2$ gas by Post-Mix via the nozzles 249a and 249b and the supply of the $O_2$ gas+$H_2$ gas by Pre-Mix via the nozzle 249b in this order may be performed a predetermined number of times (m times).

Further, in each set of the pretreatment step of the present modification, the steps B and A may be performed in this order, and in the step A, while maintaining the supply of the $H_2$ gas from the nozzle 249b, which has been performed in the step B, without being stopped, the nozzle that supplies the $O_2$ gas may be switched from the nozzle 249b to the nozzle 249a. That is, in the pretreatment step, a set including non-simultaneously performing the supply of the $O_2$ gas+$H_2$ gas by Pre-Mix via the nozzle 249b and the supply of the $O_2$ gas+$H_2$ gas by Post-Mix via the nozzles 249a and 249b in this order may be performed a predetermined number of times (m times).

Even in the present modification, the same effects as the film-forming sequence shown in FIG. 4 can be obtained.

(Modification 3)

At least one of the internal pressure of the process chamber 201 (the processing pressure) and the ratio of the supply flow rate of the $O_2$ gas to the supply flow rate of the $H_2$ gas (an $O_2/H_2$ flow rate ratio) in the step A may be different from at least one of the internal pressure of the process chamber 201 (the processing pressure) and the ratio of the supply flow rate of the $O_2$ gas to the supply flow rate of the $H_2$ gas (the $O_2/H_2$ flow rate ratio) in the step B.

This is because a lifetime of the oxidizing species generated by the reaction between the $O_2$ gas and the $H_2$ gas tends to be influenced by the processing pressures in the steps A and B. Therefore, by making the processing pressures in the steps A and B different from each other, it is possible to make the inter-wafer thickness distribution of the initial oxide layer formed on the surface of the wafers 200 by performing the steps A and B different from each other. For example, it is possible to oxidize the surface of the wafers 200 under a condition that the oxidation amount of the wafers 200 increases from the upstream side to the downstream side of the gas flow in one of the step A and the step B and oxidize the surface of the wafers 200 under a condition that the oxidation amount of the wafers 200 decreases from the upstream side to the downstream side of the gas flow in the other step.

In addition, the lifetime of the oxidizing species generated by the reaction between the $O_2$ gas and the $H_2$ gas tends to be influenced by the $O_2/H_2$ flow rate ratio. Therefore, by making the $O_2/H_2$ flow rate ratios in the steps A and B different from each other, it is possible to make the inter-wafer thickness distribution of the initial oxide layer formed on the surface of the wafers 200 by performing the steps A and B different from each other. For example, it is possible to oxidize the surface of the wafers 200 under a condition that the oxidation amount of the wafers 200 increases from the upstream side to the downstream side of the gas flow in one of the step A and the step B and oxidize the surface of the wafers 200 under a condition that the oxidation amount of the wafers 200 decreases from the upstream side to the downstream side of the gas flow in the other step.

Even in the present modification, by performing both the steps A and B as a set, the tendency of the inter-wafer thickness distribution of the initial oxide layer formed by performing the step A may be canceled by the tendency of the inter-wafer thickness distribution of the initial oxide layer formed by performing the step B. As a result, it is possible to improve the inter-wafer thickness uniformity of the initial oxide layer formed on the surface of the wafers 200, and the same effects as the film-forming sequence shown in FIG. 4 can be obtained. In the case of the present modification, the above-described effects can be obtained even when the $O_2$ gas+$H_2$ gas is supplied by Post-Mix in both the steps A and B, and, the above-described effects can be obtained even when the $O_2$ gas+$H_2$ gas is supplied by Pre-Mix in both the steps A and B.

(Modification 4)

The case where the initial oxide layer is formed on the surface of the wafers 200 by performing a set one time, the set including non-simultaneously performing the steps A and B, has been described in the pretreatment step of the film-forming sequence shown in FIG. 4. However, the initial oxide layer may be formed on the surface of the wafers 200 by performing the set multiple times. Even in the present modification, the same effects as the film-forming sequence shown in FIG. 4 can be obtained.

Other Embodiments

Some embodiments of the present disclosure have been described above in detail. However, the present disclosure is not limited to the aforementioned embodiments, but may be differently modified without departing from the spirit of the present disclosure.

For example, the present disclosure can also be applied to a case of forming a film containing Si, such as a silicon oxynitride film (SiON film), a silicon nitride film (SiN film), a silicon carbonitride film (SiCN film), a silicon oxycarbonitride film (SiOCN film), a silicon borocarbonitride film (SiBCN film), a silicon boronitride film (SiBN film), or the like on a substrate by the following film-forming sequences by using, as a reactant, a nitrogen (N)-containing gas such as an ammonia ($NH_3$) gas, a carbon (C)-containing gas such as a propylene ($C_3H_6$) gas, a gas containing N and C such as a triethylamine (($C_2H_5$)$_3$N, abbreviation: TEA) gas, a boron (B)-containing gas such as a trichloroborane ($BCl_3$) gas, or the like. Even in this case, the same effects as the above-described embodiments can be obtained. The processing procedure and process conditions for supplying these reactants may be the same as, for example, those in the step C2 of the above-described embodiments.

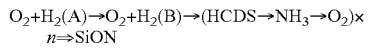
$O_2+H_2(A) \rightarrow O_2+H_2(B) \rightarrow (HCDS \rightarrow NH_3 \rightarrow O_2) \times n \Rightarrow SiON$

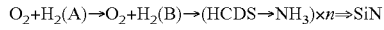
$O_2+H_2(A) \rightarrow O_2+H_2(B) \rightarrow (HCDS \rightarrow NH_3) \times n \Rightarrow SiN$

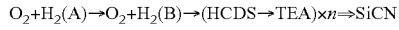
$O_2+H_2(A) \rightarrow O_2+H_2(B) \rightarrow (HCDS \rightarrow TEA) \times n \Rightarrow SiCN$

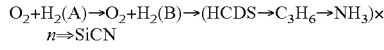
$O_2+H_2(A) \rightarrow O_2+H_2(B) \rightarrow (HCDS \rightarrow C_3H_6 \rightarrow NH_3) \times n \Rightarrow SiCN$

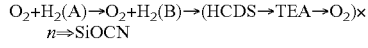
$O_2+H_2(A) \rightarrow O_2+H_2(B) \rightarrow (HCDS \rightarrow TEA \rightarrow O_2) \times n \Rightarrow SiOCN$

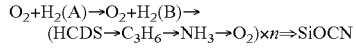
$O_2+H_2(A) \rightarrow O_2+H_2(B) \rightarrow (HCDS \rightarrow C_3H_6 \rightarrow NH_3 \rightarrow O_2) \times n \Rightarrow SiOCN$

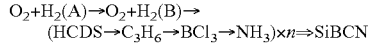
$O_2+H_2(A) \rightarrow O_2+H_2(B) \rightarrow (HCDS \rightarrow C_3H_6 \rightarrow BCl_3 \rightarrow NH_3) \times n \Rightarrow SiBCN$

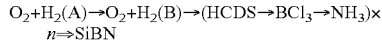
$O_2+H_2(A) \rightarrow O_2+H_2(B) \rightarrow (HCDS \rightarrow BCl_3 \rightarrow NH_3) \times n \Rightarrow SiBN$ Further, for example, the present disclosure can also be applied to a case of forming a film containing a metal element, such as a titanium nitride film (TiN film) or a titanium oxynitride film (TiON film), a titanium aluminum carbonitride film (TiAlCN film), a titanium aluminum carbide film (TiAlC film), a titanium carbonitride film (TiCN film), a titanium oxide film (TiO film), or the like on a substrate by using, as a precursor, a titanium tetrachloride ($TiCl_4$) gas, a trimethylaluminum (Al($CH_3$)$_3$, abbreviation: TMA) gas, or the like. Even in this case, the same effects as the above-described embodiments can be obtained.

Recipes used in the substrate processing may be provided individually according to the processing contents and may be stored in the memory device 121c via a telecommunication line or the external memory device 123. Moreover, at the beginning of the substrate processing, the CPU 121a may properly select an appropriate recipe from the recipes stored in the memory device 121c according to the contents of the substrate processing. Thus, it is possible for a single substrate processing apparatus to form films of various kinds, composition ratios, qualities, and thicknesses with enhanced reproducibility. Further, it is possible to reduce an operator's burden and to quickly start the substrate processing while avoiding an operation error.

The recipes mentioned above are not limited to newly-provided ones but may be provided, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

In the above-described embodiments, examples have been described in which the first to third nozzles (the nozzles 249a to 249c) as the first to third supply parts are provided in the process chamber along the inner wall of the reaction tube. However, the present disclosure is not limited to the above embodiments. For example, as illustrated in the cross-sectional structure of the vertical process furnace in FIG. 5A, a buffer chamber is installed at the sidewall of the reaction tube, and the first to third nozzles having the same configuration as the above embodiments may be installed in the buffer chamber in the same arrangement as that of the above embodiments. FIG. 5A shows an example in which a supply buffer chamber and an exhaust buffer chamber are installed at the sidewall of the reaction tube, and are arranged at opposing positions with a wafer interposed therebetween. Each of the supply buffer chamber and the exhaust buffer chamber is installed between the upper portion and the lower portion of the sidewall of the reaction tube, that is, along the wafer arrangement region. Further, FIG. 5A shows an example in which the supply buffer chamber is partitioned into a plurality of (three) spaces and each nozzle is arranged in each space. The arrangement of the three spaces in the buffer chamber is the same as the arrangement of the first to third nozzles. The spaces in which the first to third nozzles are arranged may also be referred to as first to third buffer chambers, respectively. The first nozzle and the first buffer chamber, the second nozzle and the second buffer chamber, and the third nozzle and the third buffer chamber may be considered as a first supply part, a second supply part, and a third supply part, respectively. Further, for example, as illustrated in the cross-sectional structure of the vertical process furnace in FIG. 5B, the buffer chamber may be installed in the same arrangement as that in FIG. 5A, the third nozzle may be installed in the buffer chamber, and the first and second nozzles may be installed along the inner wall of the reaction tube with a communication part of the buffer chamber with the process chamber interposed between both sides. The first nozzle, the second nozzle, and the third nozzle and the buffer chamber may be considered as the first supply part, the second supply part, and the third supply part, respectively. The configuration other than the buffer chamber and the reaction tube described in FIGS. 5A and 5B is the same as the configuration of each part of the process furnace illustrated in FIG. 1. Even when these process furnaces are used, the same substrate processing as that of the above embodiments can be performed, and the same effects as those of the above embodiments can be obtained.

The examples in which a film is formed by using a batch-type substrate processing apparatus capable of processing a plurality of substrates at a time has been described in the aforementioned embodiments. The present disclosure is not limited to the aforementioned embodiments, but may be suitably applied, for example, to a case where a film is formed by using a single-wafer type substrate processing apparatus capable of processing a single substrate or several substrates at a time. When a single-wafer type substrate processing apparatus configured to process the single substrate at a time is used, the substrate in-plane thickness uniformity of the initial oxide layer formed on the surface of the substrate can be improved, which results in improving the substrate in-plane film thickness uniformity of the film formed on the substrate. In addition, the examples in which a film is formed by using a substrate processing apparatus provided with a hot-wall-type process furnace have been described in the aforementioned embodiments. The present disclosure is not limited to the aforementioned embodiments, but may be suitably applied to a case where a film is formed by using a substrate processing apparatus provided with a cold-wall-type process furnace.

Even in the case of using these substrate processing apparatuses, substrate processing may be performed according to the same sequences and process conditions as those in the aforementioned embodiments and modifications, and the same effects as those of the aforementioned embodiments and modifications can be achieved.

The aforementioned embodiments and modifications may be used in a proper combination. The processing procedures and process conditions used in such a case may be the same as, for example, the processing procedures and process conditions of the aforementioned embodiments.

EXAMPLES

As an Example, the substrate processing apparatus illustrated in FIG. 1 was used to form a SiO film on a wafer by the film-forming sequence shown in FIG. 4. The process conditions in the pretreatment step and the film-forming step were set to predetermined conditions within the process condition ranges in the pretreatment step and the film-forming step of the aforementioned embodiments, respectively.

As a Comparative Example 1, the substrate processing apparatus illustrated in FIG. 1 was used to form a SiO film on a wafer by performing the pretreatment step of oxidizing the surface of the wafer and the film-forming step in this order. In the pretreatment step, only the step A of the film-forming sequence shown in FIG. 4 was performed and the step B was not performed. Except for this point, the pretreatment step and the film-forming step in Comparative Example 1 had the same processing procedure and process conditions as the pretreatment step and the film-forming step in the Example, respectively.

As Comparative Example 2, the substrate processing apparatus illustrated in FIG. 1 was used to form a SiO film on a wafer by performing the pretreatment step of oxidizing the surface of the wafer and the film-forming step in this order. In the pretreatment step, only the step B of the film-forming sequence shown in FIG. 4 was performed and the step A was not performed. Except for this point, the pretreatment step and the film-forming step in Comparative Example 2 had the same processing procedure and process conditions as the pretreatment step and the film-forming step in the Example, respectively.

Figure 6A:
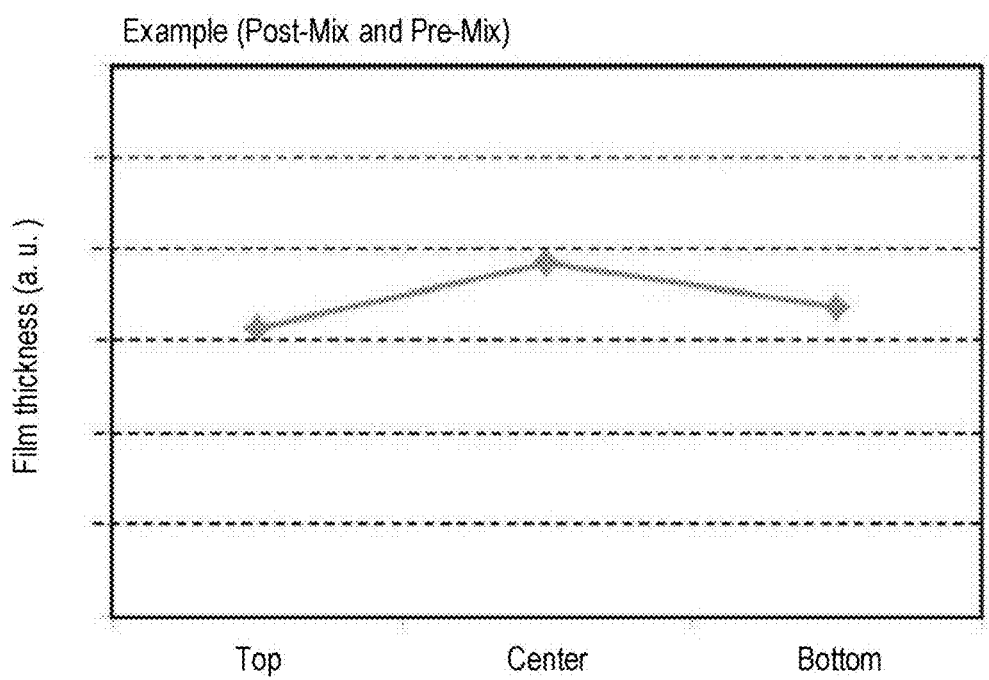
FIG. 6A is a diagram showing evaluation results of an inter-substrate film thickness uniformity of a film formed on a substrate in the Example.
Figure 6B:
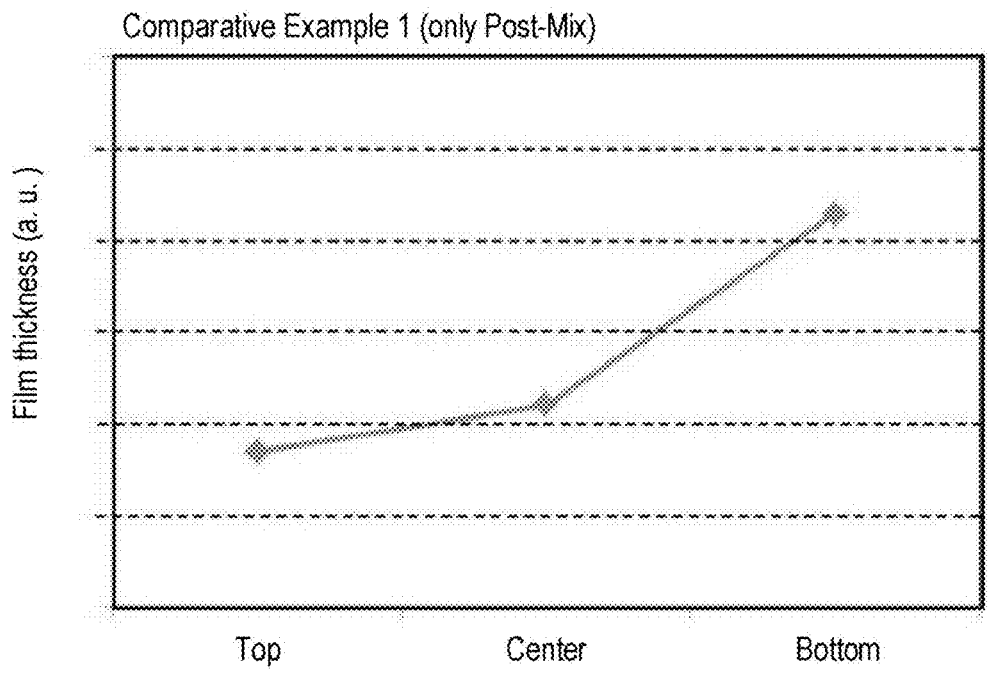
FIGS. 6B and 6C are diagrams showing evaluation results of an inter-substrate film thickness uniformity of a film formed on a substrate in the Comparative Examples, respectively.
Figure 6C:
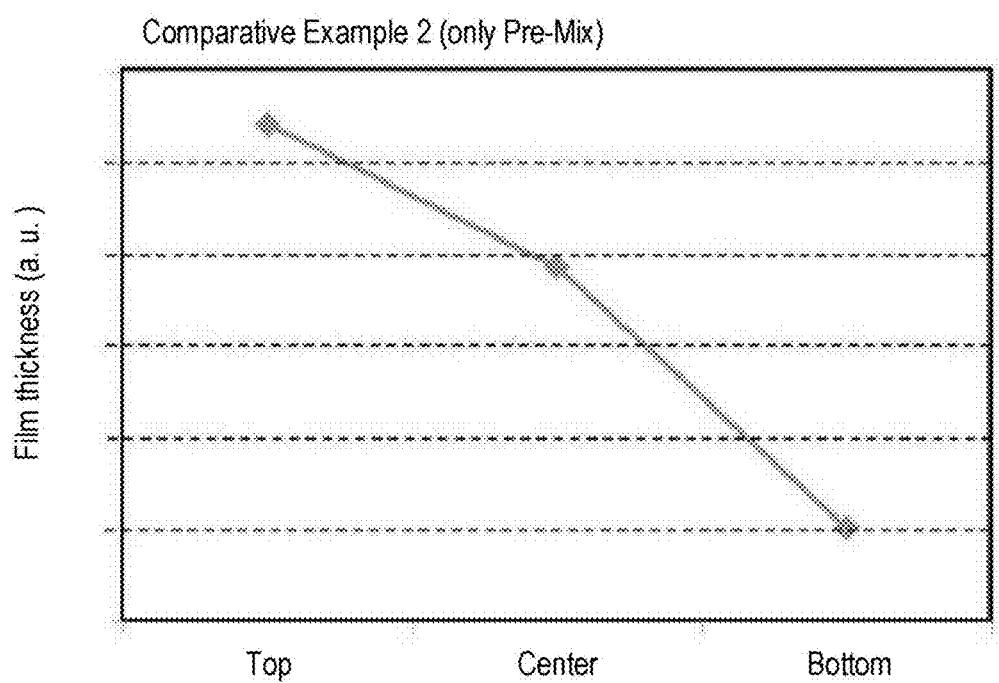

Thereafter, the inter-wafer film thickness uniformities of the SiO films formed in the Example and Comparative Examples 1 and 2 was evaluated. FIGS. 6A to 6C show the evaluation results of the Example and Comparative Examples 1 and 2 in order. The vertical axis in FIGS. 6A to 6C represents a total film thickness (a.u.) of the initial oxide layer formed in the pretreatment step and the SiO film formed in the film-forming step. The horizontal axis in FIGS. 6A to 6C represents positions of the wafer in a wafer arrangement region, specifically, an upper portion (Top), a central portion (Center), and a lower portion (Bottom).

As shown in FIG. 6A, it can be seen that the SiO film in the Example has substantially an uniform film thickness from Top to Bottom, that is, from the upstream side to the downstream side of the gas flow, and thus has good wafer-to-wafer film thickness uniformity.

On the other hand, as shown in FIG. 6B, it can be seen that the SiO film in Comparative Example 1 increases in film thickness from Top to Bottom, that is, from the upstream side to the downstream side of the gas flow, and thus has poorer inter-wafer film thickness uniformity than that in the Example. Further, as shown in FIG. 6C, it can be seen that the SiO film in Comparative Example 2 decreases in film thickness from Top to Bottom, that is, from the upstream side to the downstream side of the gas flow, and thus has poorer inter-wafer film thickness uniformity than that in the Example. Further, it can be seen that the inter-wafer thickness distributions of the SiO films in Comparative Examples 1 and 2 tend to be opposite to each other.

In this way, it has been found that a higher inter-wafer thickness uniformity of the SiO film formed on the wafer can be provided in the Example in which both the steps A and B are performed as a set in the pretreatment step than in Comparative Examples 1 and 2 in which only one of the steps A and B is performed in the pretreatment step.

According to the embodiments of the present disclosure, it is possible to improve the film thickness uniformity of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of improving a film thickness uniformity of a film formed on a substrate, comprising:
   forming an initial oxide layer on a surface of the substrate by performing a set m times (where m is an integer equal to or greater than 1), the set including non-simultaneously performing:

(a) oxidizing the surface of the substrate under a condition that an oxidation amount of the substrate increases from an upstream side to a downstream side of a gas flow by supplying an oxygen-containing gas and a hydrogen-containing gas to the substrate;

(b) oxidizing the surface of the substrate under a condition that the oxidation amount of the substrate decreases from the upstream side to the downstream side of the gas flow by supplying the oxygen-containing gas and the hydrogen-containing gas to the substrate;

forming the film on the initial oxide layer by supplying a precursor gas to the substrate; wherein (a) is performed under a condition that a thickness of a first initial oxide layer formed on the surface of the substrate increases from the upstream side to the downstream side of the gas flow, and (b) is performed under a condition that the thickness of a second initial oxide layer formed on the surface of the substrate decreases from the upstream side to the downstream side of the gas flow;

wherein in the act of forming the film on the initial oxide layer, an oxide film is formed as the film on the initial oxide layer by performing a cycle n times (where n is an integer equal to or greater than 1), the cycle including non-simultaneously performing:

supplying the precursor gas to the substrate; and supplying the oxygen-containing gas and the hydrogen-containing gas to the substrate.

2. The method of claim 1, wherein in (a), the oxygen-containing gas and the hydrogen-containing gas are supplied from different suppliers to the substrate, and in (b), the oxygen-containing gas and the hydrogen-containing gas are supplied from the same supplier to the substrate.

3. The method of claim 2, wherein in (a), the oxygen-containing gas and the hydrogen-containing gas are mixed in a space where the substrate is placed, and in (b), the oxygen-containing gas and the hydrogen-containing gas are mixed in the same supplier.

4. The method of claim 1, wherein in (a), the oxygen-containing gas is supplied from a first supplier and the hydrogen-containing gas is supplied from a second supplier, and in (b), the oxygen-containing gas and the hydrogen-containing gas are supplied from the first supplier.

5. The method of claim 4, wherein in the act of forming the initial oxide layer, (a) and (b) are performed in this order, and wherein in (b), the supplier of the hydrogen-containing gas is switched from the second supplier to the first supplier while the supply of the oxygen-containing gas from the first supplier, which has been performed in (a), is continued without being stopped.

6. The method of claim 4, wherein in the act of forming the initial oxide layer, (b) and (a) are performed in this order, and wherein in (a), the supplier of the hydrogen-containing gas is switched from the first supplier to the second supplier while the supply of the oxygen-containing gas from the first supplier, which has been performed in (b), is continued without being stopped.

7. The method of claim 1, wherein in (a), the oxygen-containing gas is supplied from a first supplier and the hydrogen-containing gas is supplied from a second supplier, and wherein in (b), the oxygen-containing gas and the hydrogen-containing gas are supplied from the second supplier.

8. The method of claim 7, wherein in the act of forming the initial oxide layer, (a) and (b) are performed in this order, and wherein in (b), the supplier of the oxygen-containing gas is switched from the first supplier to the second supplier while the supply of the hydrogen-containing gas from the second supplier, which has been performed in (a), is continued without being stopped.

9. The method of claim 7, wherein in the act of forming the initial oxide layer, (b) and (a) are performed in this order, and wherein in (a), the supplier of the oxygen-containing gas is switched from the second supplier to the first supplier while the supply of the hydrogen-containing gas from the second supplier, which has been performed in (b), is continued without being stopped.

10. The method of claim 1, wherein in the act of forming the initial oxide layer, (a) and (b) are performed continuously without purging a space where the substrate is placed, between (a) and (b).

11. The method of claim 1, wherein in (a) and (b), the surface of the substrate is oxidized under a condition that a supply flow rate of the hydrogen-containing gas is higher than a supply flow rate of the oxygen-containing gas.

12. The method of claim 1, wherein a supply time of the oxygen-containing gas and the hydrogen-containing gas in (a) is set to be longer than a supply time of the oxygen-containing gas and the hydrogen-containing gas in (b).

13. The method of claim 12, wherein the supply time of the oxygen-containing gas and the hydrogen-containing gas in (b) is set to be longer than a supply duration time of the oxygen-containing gas and the hydrogen-containing gas in the act of forming the film on the initial oxide layer.

14. The method of claim 1, wherein at least one of a pressure of a space where the substrate is placed and a ratio of a supply flow rate of the oxygen-containing gas to a supply flow rate of the hydrogen-containing gas in (a) is set to be different from at least one of a pressure of the space where the substrate is placed and a ratio of a supply flow rate of the oxygen-containing gas to a supply flow rate of the hydrogen-containing gas in (b).

* * * * *